United States Patent [19]

Kojima et al.

[11] Patent Number: 5,157,471
[45] Date of Patent: Oct. 20, 1992

[54] SEMICONDUCTOR NON-VOLATILE MEMORY DEVICE

[75] Inventors: Makoto Kojima, Suita; Takashi Takata, Takatsuki, both of Japan

[73] Assignee: Matsushita Electronics Corporation, Osaka, Japan

[21] Appl. No.: 353,331

[22] Filed: May 16, 1989

[30] Foreign Application Priority Data

May 16, 1988 [JP] Japan .................. 63-118540

[51] Int. Cl.[5] .............................................. H01L 29/78
[52] U.S. Cl. .................... 357/23.14; 357/23.5; 357/41; 357/24
[58] Field of Search ............... 357/23.5, 23.14, 41, 357/40, 24; 437/41, 42, 43, 52, 59

[56] References Cited

U.S. PATENT DOCUMENTS

| | | |
|---|---|---|
| 3,893,152 | 7/1975 | Lin ............................ 357/23.5 |
| 4,233,526 | 11/1980 | Kurogi et al. ................ 357/23.5 |
| 4,380,804 | 4/1983 | Lockwood et al. ............ 357/23.5 |
| 4,476,478 | 10/1984 | Noguchi et al. .............. 357/23.1 |
| 4,501,007 | 2/1985 | Jensen ........................ 357/24 |
| 4,613,956 | 9/1986 | Paterson et al. ............. 357/23.5 |
| 4,652,339 | 3/1987 | Bluzer et al. ................ 357/24 |
| 4,803,706 | 2/1989 | Murayama et al. ............ 357/24 |
| 4,903,098 | 2/1990 | Smit et al. .................. 357/24 |

FOREIGN PATENT DOCUMENTS

| | | | |
|---|---|---|---|
| 60-182162 | 9/1985 | Japan | 357/23.5 |
| 61-003458 | 1/1986 | Japan | 357/23.14 |
| 61-193484 | 8/1986 | Japan | 357/23.5 |
| 62-160765 | 7/1987 | Japan | 357/24 |
| 63-001053 | 1/1988 | Japan | 357/23.5 |
| 63-045863 | 2/1988 | Japan | 357/23.5 |
| 63-124467 | 5/1988 | Japan | 357/23.14 |

OTHER PUBLICATIONS

Vieth, Nitride-oxide layer proof memory against data loss, Jul. 5, 1971 Electronics, p. 53 357 & 23.5.

Primary Examiner—Jerome Jackson, Jr.
Attorney, Agent, or Firm—Wenderoth, Lind & Ponack

[57] ABSTRACT

A semiconductor non-volatile memory device, has plural data storage parts which are connected in series between the source region and drain region. In such a constitution, when integrating the semiconductors, the relative area occupied by the selection gate, separation gate, source region and drain region of the area of the data storage parts may be drastically reduced, and the degree of integration of the semiconductor non-volatile memory device can be dramatically enhanced. The device also allows for setting the semiconductor substrate in a depletion state by sequentially varying the gate potential of the plural data storage parts and transferring the electric charges sequentially. By this transferring of electric charges, data write errors may be prevented.

3 Claims, 9 Drawing Sheets

FIG. 4 (Read Mode)

FIG. 5 (Erase Mode)

FIG. 6 (Write and Write Disenable Mode)

SEMICONDUCTOR NON-VOLATILE MEMORY DEVICE

BACKGROUND OF THE INVENTION

This invention relates to a semiconductor non-volatile memory device composed of semiconductors.

Recently the degree of integration of semiconductor memory device has drastically increased, and along with the increase in the degree of integration, its application fields are expanding. In this trend, a semiconductor non-volatile memory that can be electrically rewritten has been applied only in limited fields including replacement with DIP switches, etc., and data memories of small capacity because of its low degree of integration.

The following is a description of an MNOS type semiconductor non-volatile memory that is well known among the semiconductor non-volatile memories.

A MNOS transistor comprises, as an insulation film beneath the gate, a very thin oxide layer with a thickness of about 20 angstroms disposed at the semiconductor substrate side, and a silicon nitride layer ($Si_3N_4$) of several hundred angstroms disposed on its surface, and by applying a high electric field between the gate and the portion immediately beneath the gate, holes or electrons are accumulated in the trap in the silicon nitride layer by the tunnel current, and the threshold voltage of the MNOS transistor is varied, thereby storing the information.

A conventional example of a semiconductor non-volatile memory using such MNOS transistor is explained while referring to FIG. 13, which is a sectional view of a memory cell block of an N type MNOS semiconductor non-volatile memory of the one-transistor, tri-gate type (e.g.—see Japanese Patent Publication No. Sho 57-29861).

In FIG. 13, an N+ diffusion source line 2 (source region) and an N+ diffusion drain 3 (drain region) are formed in a P type silicon substrate 1. On the surface of the silicon substrate 1 adjacent to the diffusion source line 2 and diffusion drain 3, oxide layers 4, 4 are formed, and a separation gate 5 and a selection gate 6 are formed on the surface of the oxide layers 4, 4 respectively. On the surfaces of the separation gate 5 and selection gate 6, and on the surface of the silicon substrate 1 between these gates 5, 6, a very thin oxide layer 7 of about 20 angstroms in thickness is formed. Furthermore, on the surface of this very thin oxide layer 7, a silicon nitride layer ($Si_3N_4$) 8 of about several hundred angstroms in thickness is formed. On the surface of the silicon nitride layer 8, an MNOS gate 9 is formed. The entire surface of the silicon substrate 1 is covered with an insulation film 10, and on its surface, a patterned aluminum bit line 11 is formed. Part of the bit line 11 penetrates through the insulation film 10, and contacts the diffusion drain 3.

In the construction in FIG. 13, it is the portion of the MNOS gate 9 that is responsible for storing information, and the separation gate 5, in the write disabled stated, prevents the high voltage supplied to the diffusion drain 3 from flowing into the diffusion source line 2 regardless of the gate state of the MNOS gate 9 and the selection gate 6.

However, in such a conventional semiconductor non-volatile memory, there is only one MNOS gate 9, that is, only one information memory device in one memory cell block. Accordingly, for one information memory device, two gates not storing information, that is, the selection gate 6 and separation gate 5 are needed, and it was extremely difficult to raise the degree of integration of the semiconductor chips from the viewpoint of integration of information.

SUMMARY OF THE INVENTION

It is hence a parimary object of this invention to present a semiconductor non-volatile memory device capable of raising the degree of integration as seen from the viewpoint of integration of information. In other words, this invention is to realize a semiconductor non-volatile memory having a larger capacity by using the same design rule as employed hitherto.

It is a secondary object of this invention to present a semiconductor non-volatile memory device capable of a writing data without error in plural data storing portions.

This invention, in sum, has plural data storing portions disposed between the source region and drain region of memory cell block. In this configuration, when integrating the semiconductors, only the area of the data storing portions increases. To wit, the relative area occupied by the selection gate, separation gate, source region, and drain region with respect to the area of the data storing portions can be notably reduced, and the degree of integration of the semiconductor non-volatile memory device can be out-standingly enhanced.

Other objects of the invention will be clarified in the embodiments described below in conjunction with the accompanying drawings.

DETAILED DESCRIPTION OF THE INVENTION

Figure 1:
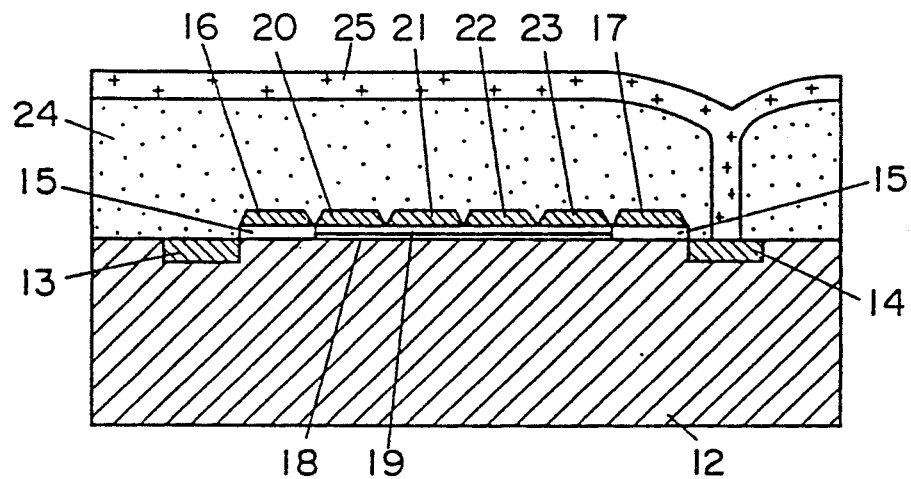
FIG. 1 is a sectional view of a memory cell block of a semiconductor non-volatile memory device in accordance with a first embodiment of the present invention.

Referring now to the drawings, a first embodiment of the present invention is described below.

FIG. 1 shows a unit memory cell block of an N channel type MNOS semiconductor non-volatile memory device relating to the present invention, and in this example, the MNOS gate is connected in four stages in series. Four memory cells are contained in this one memory cell block.

In FIG. 1, in a P type silicon substrate 12, an N+ diffusion source line (source region) 13 set at the ground level is formed. Also in this silicon substrate 12, an N+ diffusion drain 14 for forming a drain region in pair with the diffusion source line 13 is formed. An oxide layer 15 is formed on the surface of the silicon subtrate 12 adjacent to the diffusion source line 13, and on the surface of this oxide layer 15, a separation gate 16 for cutting off the current route when the writing is disabled is formed. On the other hand, on the surface of the silicon substrate 12 adjacent to the diffusion drain 14, another oxide layer 15 is formed, and a selection gate 17 for selecting the address is formed on the surface of this oxide layer 15. On the surface of the silicon substrate 12 between these oxide layers 15, 15, a very thin oxide layer 18 of about 20 angstroms in thickness is formed, and on the surface of this very thin oxide layer 18, a silicon nitride ($Si_3N_4$) layer 19 of several hundred angstroms in thickness is formed. On the surface of this silicon nitride layer 19, four MNOS gates 20, 21, 22, and 23 are formed in a series connection. On the entire surface of the silicon substrate 12, an insulation film 24 is formed, and a bit line 25 of patterned aluminum is formed on its surface. Part of the bit line 25 penetrates through the insulation film 24, and contacts the diffusion drain 14.

Thus is composed an MNOS transistor in which the mutually independent six gates 16, 17, 20 to 23 function as multigates in the channel portion between the diffusion source line 13 and diffusion drain 14.

Here, before explanation of the operation in FIG. 1, the required characteristics of the MNOS gates 20 to 23, that is, the device design of MNOS gates 20 to 23 when the MNOS transistor structured as shown in FIG. 1 is composed must be explained in the first place.

Figure 2:
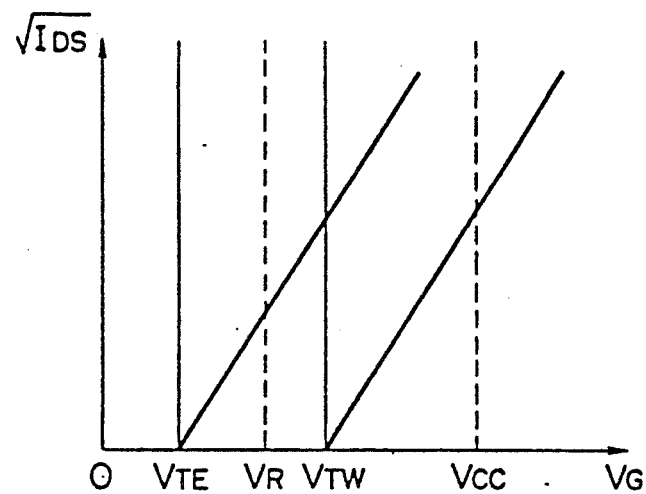
FIG. 2 is a voltage-current characteristic curve for explaining the operation of FIG. 1.

FIG. 2 shows the relationship of source-drain current ($I_{DS}$) and gate voltage ($V_G$) in an independent MNOS gate. The abscissas axis denotes the gate voltage ($V_G$), and the ordinate axis indicates the route of source-drain current ($I_{DS}$). In the N channel MNOS gate, on the basis of the substrate voltage, a positive high voltage is applied to the gate, and electrons are implanted so as to set at the ground level beneath the channel immediately under the gate, and by holding this state for several milliseconds, the threshold voltage of the MNOS gate transistor can be shifted in the positive direction. (Such a mode is called the write mode, and the threshold voltage after this shift is called VTW.) On the contrary, on the basis of the substrate voltage, by applying a negative high voltage to the MNOS gate and holding this state for several milliseconds, the threshold voltage of the MNOS gate transistor can be shifted in the negative direction. (Such a mode is called the erase mode, and the threshold voltage after this shift is called VTE.) The difference between the threshold voltages VTW and VTE is called a window width, and this window width is determined by the thickness of the very thin oxide layer and silicon nitride layer of the MNOS transistor, and also by the applied voltage and duration of the high voltage mentioned above. The absolute values of the both threshold voltages VTW, VTE are determined by the impurity profile beneath the gate. That is, by adequate device design and circuit design, it is possible to set, as shown in FIG. 2, the threshold voltage VTW approximately below the supply voltage VTE above zero volts.

Figure 3:
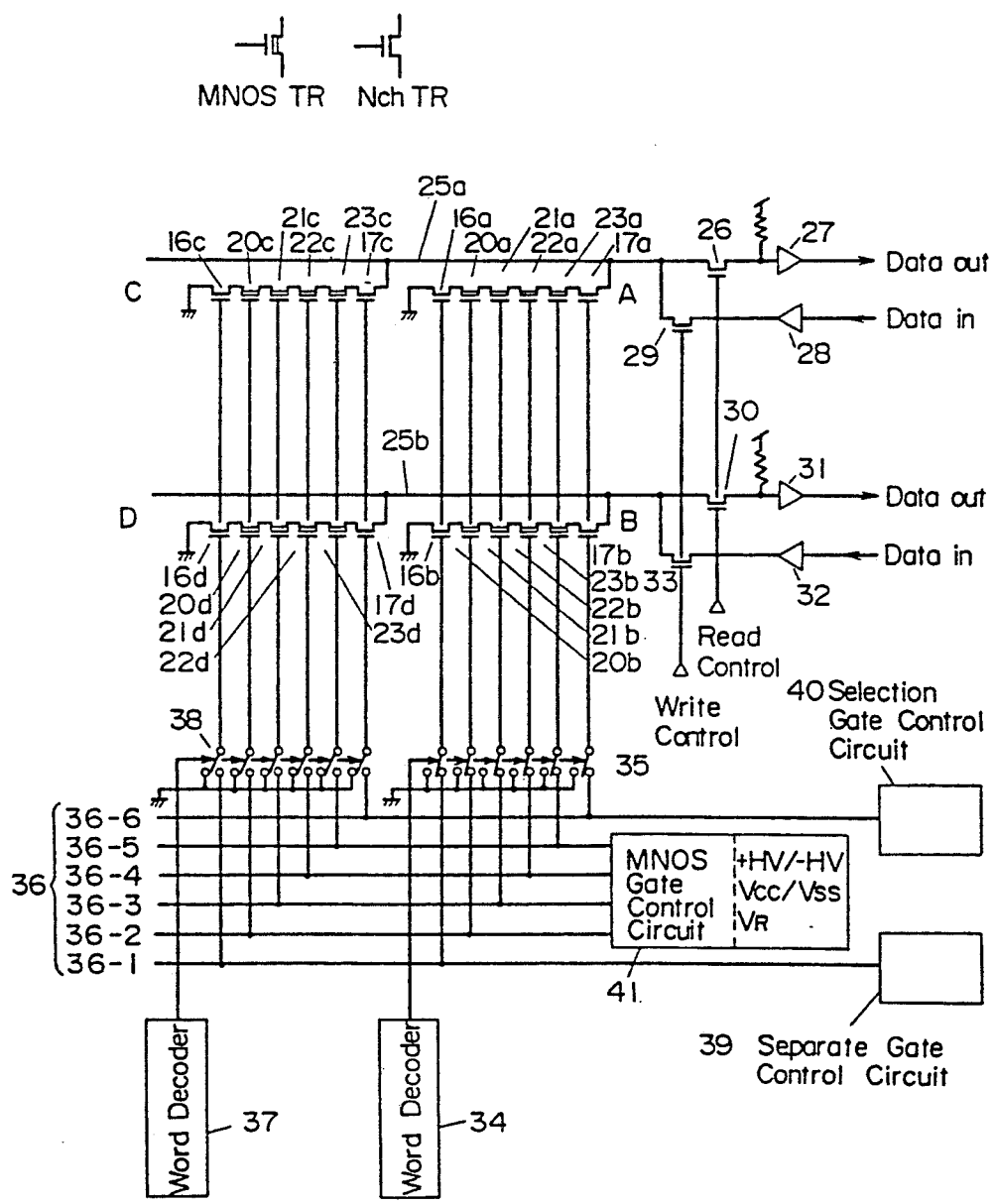
FIG. 3 is a circuit diagram showing the memory cell block and its peripheral circuit in FIG. 1.

FIG. 3 shows the MNOS non-volatile memory device shown in FIG. 1 and its driving circuit.

In FIG. 3, four MNOS memory cell blocks A, B, C, D correspond to the memory cell blocks in FIG. 1, and are individually furnished with separation gates 16a to 16d, selection gates 17a to 17d, and MNOS gates 20a to 20d, 21a to 21d, 22a to 22d, and 23a to 23d. The selection gates 17a and 17c are connected to a bit line 25a, while the selection gates 17b and 17d are connected to a bit line 25b. The data of the bit line 25a is delivered through a gate 26 and an amplifier 27. To the bit line 25a, data is fed through an amplifier 28 and a gate 29. On the other hand, the data of bit line 25b is delivered through a gate 30 and an amplifier 31. To the bit line 25b, data is fed through an amplifier 32 and a gate 33. The gates 26 and 30 are turned on or off by a read control signal. The gates 29 and 33 are turned on or off by a write control signal. The gates of the MNOS memory cell blocks A and B are connected to six control lines 36 through a switch 35 which is turned on or off by a word decoder 34, and the gates of the MNOS memory cell blocks C and D are connected to these six control lines 36 through a switch 38 which is turned on or off by a word decoder 37. The control lines at both ends 36-1, 36-6 of the control lines 36 are respectively connected to a separation gate control circuit 39 and a selection gate control circuit 40, and the middle four control lines 36-2 to 36-5 are connected to an MNOS gate control circuit 41. From the MNOS gate control circuit 41 to the four control lines 36-2 to 36-5, a positive high voltage (+HV), a negative high voltage (−HV), a supply voltage (Vcc), a reference voltage (Vss) and a reading voltage ($V_R$) are selectively supplied.

Figure 4:
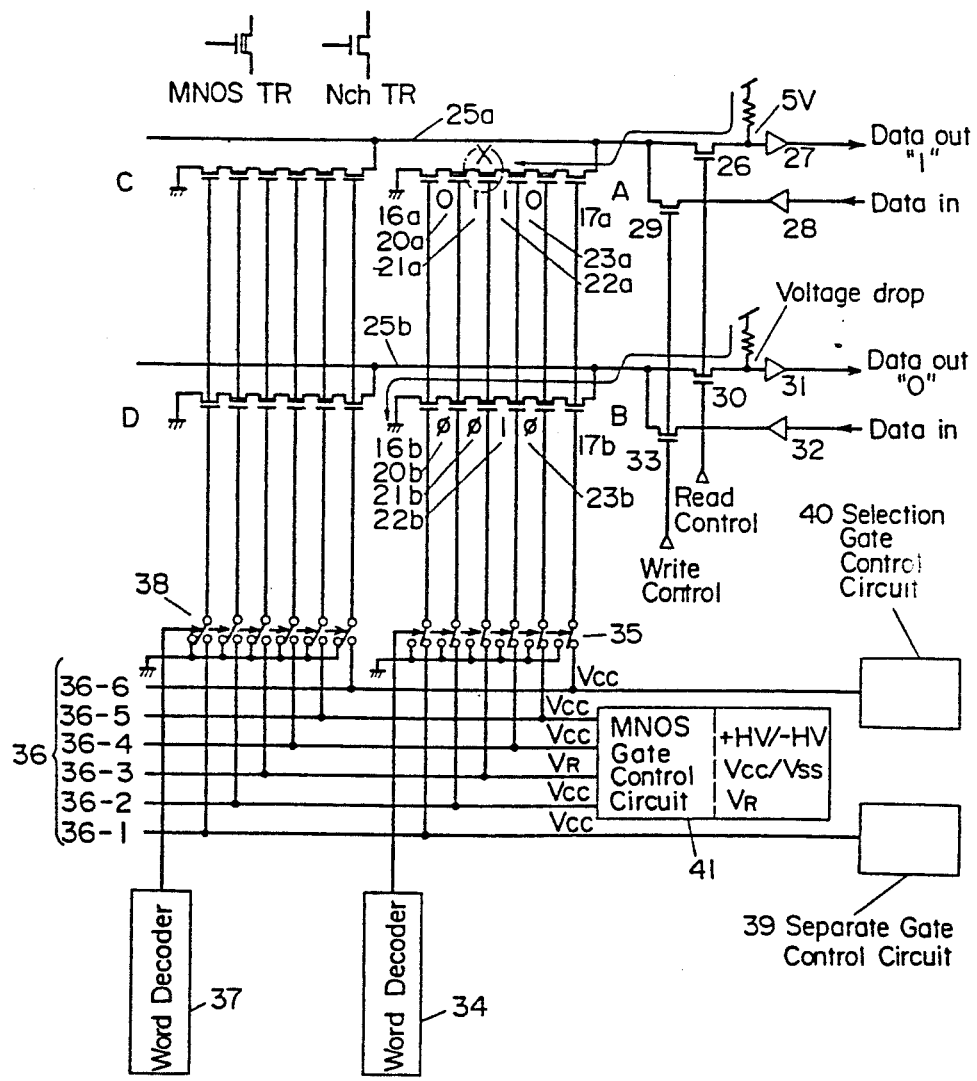
FIG. 4 is a circuit diagram for explaining the operation of the read mode in the first embodiment.
Figure 5:
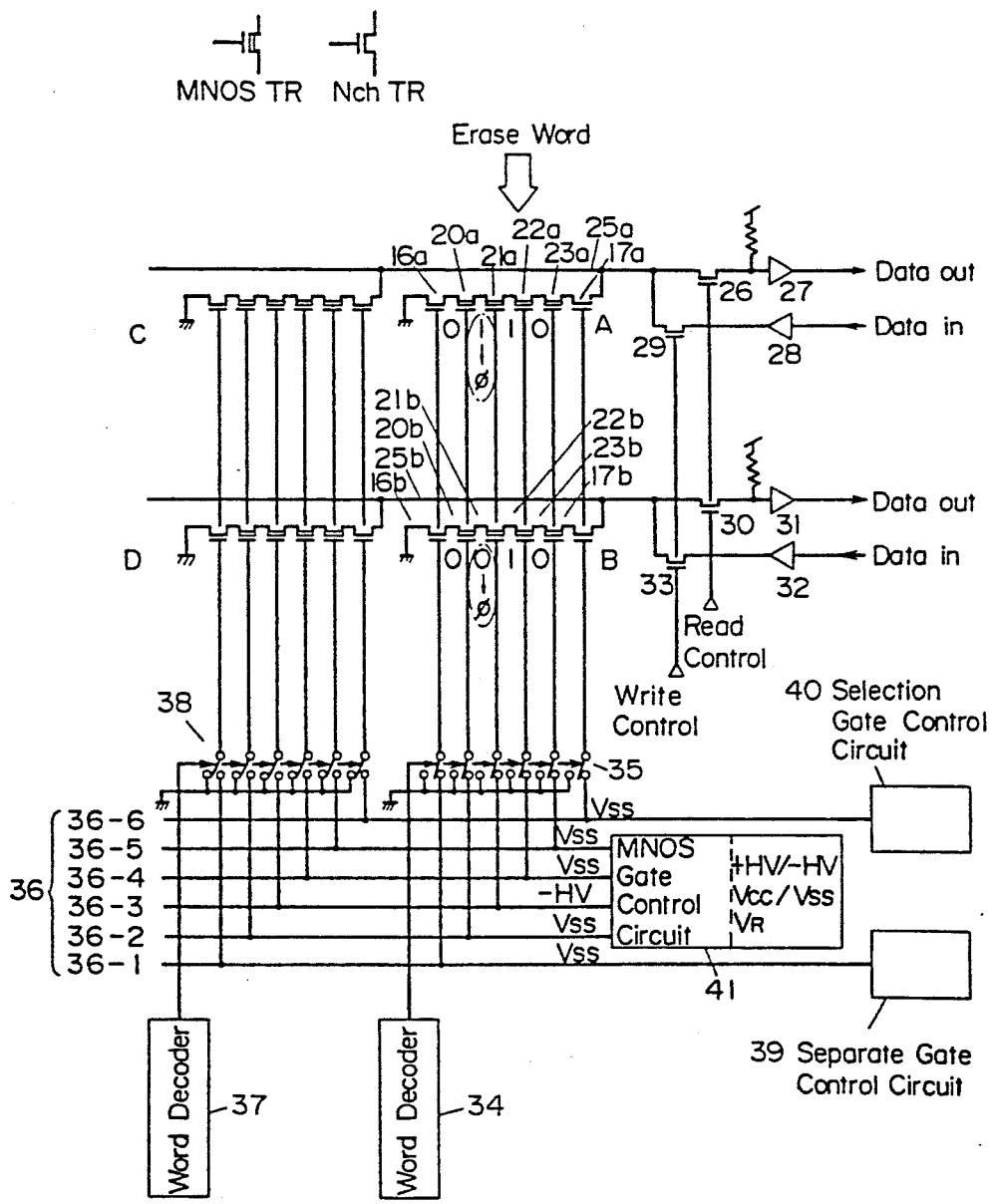
FIG. 5 is a circuit diagram for explaining the operation of the erase mode in the first embodiment.
Figure 6:
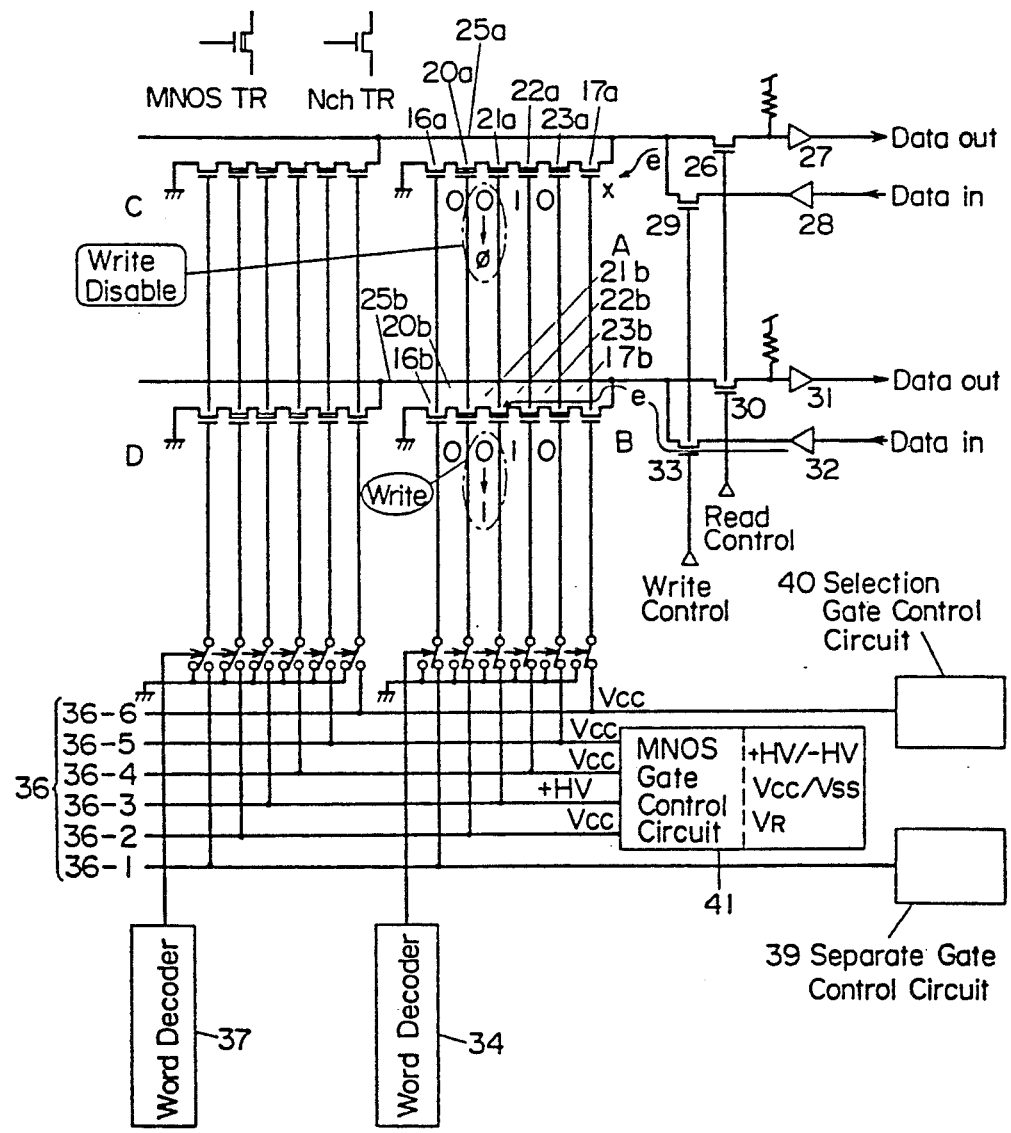
FIG. 6 is a circuit diagram for explaining the operation of the write and write disable modes of the first embodiment.
Figure 7:
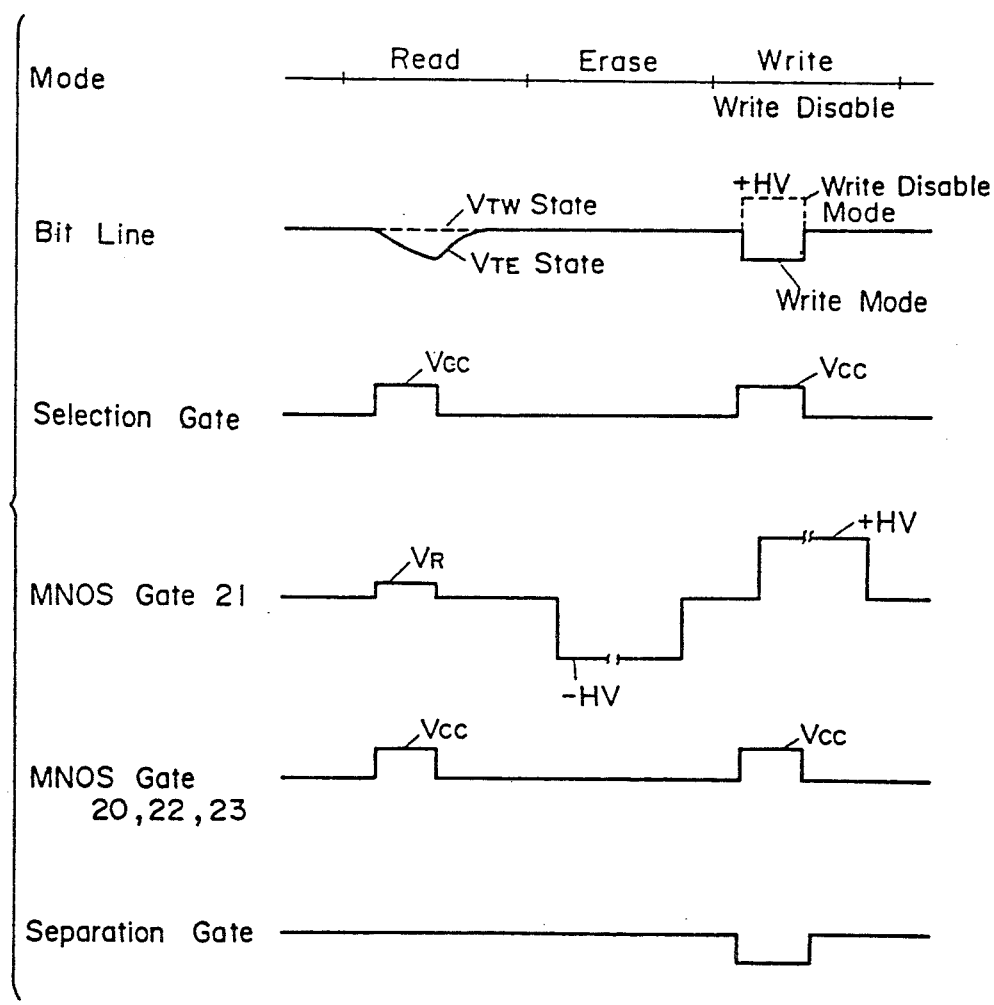
FIG. 7 shows voltage waveform diagrams for the operations shown in FIG. 4 to FIG. 6.

FIG. 4 is a diagram for explaining the operation of the read mode, FIG. 5 is a diagram for explaining the operation of the erase mode, FIG. 6 is a diagram for explaining the operation of the write mode, and FIG. 7 shows timing charts of these modes.

Referring to FIG. 3 to FIG. 7, the operation of each mode is explained below.

Read mode:

In FIG. 4, data "0", "1", "1", "0" are written in four MNOS gates 20a, 21a, 22a, 23a of the memory cell block A, and data "0", "0", "1", "0" are written on four MNOS gates 20b, 21b, 22b, 23b of the memory cell block B, respectively. Data "1" is the written state and corresponds to the right side characteristic shown in FIG. 2. On the other hand, data "0" is the erased state and corresponds to the left side characteristic shown in FIG. 2.

Suppose, now, the MNOS gates from which the data are to be read are MNOS gates 21a and 21b of the memory cell blocks A and B.

In the read mode, the gates 26 and 30 are turned on by a read control signal (the gates 29 and 33 remain an OFF state). On the other hand, by the word decoder 34, the switch 35 is turned on, while the switch 38 is turned off by the word decoder 37. In this state, Vcc is supplied from the selection gate control circuit 40 to the control line 36-6, and Vcc is supplied from the separation gate control circuit 39 to the control line 36-1. From the MNOS gate control circuit 41 to the control lines 36-2, 36-4, 36-5, Vcc is supplied, and a reading voltage $V_R$ is supplied to the control line 36-3. By the Vcc on the control line 36-1, the separation gates 16a and 16b of the memory cell blocks A and B are turned on, and the selection gates 17a and 17b of the memory cell blocks A and B are turned on by Vcc on the control line 36-6.

As evident from FIG. 2, in the N-channel MNOS gate, when Vcc is applied to the gate, it is turned on whether the data is "0" or "1". However, when the reading voltage $V_R$ is fed to the gate, the MNOS gate is turned on if the data is "0" (erased), and turned off if the data is "1" (written). Therefore, by the Vcc on the control lines 36-2, 36-4, 36-5, the MNOS gates 20a, 22a, 23a, and 20b, 22b, 23b of the memory cell blocks A and B are turned on. Besides, by the reading voltage $V_R$ on the control lines 36-3, the MNOS gate 21b of the memory cell block B (data "0") is turned on, while the MNOS gate 21a of the memory cell block A (data "1") maintains its off state. As a result, current does not flow in the gate row 16a, 20a to 23a, 17a of the memory cell block A, and the data output of the data line 25a becomes "1", and the data "1" written in the MNOS gate 21a is read out. On the other hand, since all of the gate row 16b, 20b to 23b, 17b of the memory cell block B are turned on, a current flows. Accordingly, a voltage drop occurs at the input side of the amplifier 31, and the data output of the data line 25b becomes "0", and thus the data "0" written (erased) in the MNOS gate 21b is read out.

At this time, all switches 38 are turned off by the word decoder 37, and therefore the data in the memory cell blocks C and D are not read out.

By such an operation, the data in the MNOS gates of all of the memory cell blocks can be read out from the data lines 25a and 25b.

Erase mode:

The N-channel MNOS gate can erase the data by applying a negative high voltage ($-HV$) as compared with the substrate voltage (Vss) to its gate and holding this state for several milliseconds. That is, when a negative high voltage is applied to the gate, the holes existing in the substrate immediately beneath the gate are attracted to the gate side (this state is called the accumulation state). In other words, the holes tunnel through the very thin oxide layer and are trapped in the silicon nitride layer, and thus the hitherto stored data (namely, stored electrons) are erased.

FIG. 5 shows the operation in the erase mode. In FIG. 5, data "0", "1", "1", "0" are respectively written in the four MNOS gates 20a, 21a, 22a, 23a of the memory cell block A, and data "0", "0", "1", "0" are written in the four MNOS gates 20b, 21b, 22b, 23b of the memory cell block A. Suppose the MNOS gates to be erased are the MNOS gate 21a of the memory cell block A and the MNOS gate 21b of the memory cell block B.

In the erase mode, a negative high voltage ($-HV$) is supplied from the MNOS gate control circuit 41 to the control line 36-3, and the substrate voltage (Vss) is supplied to all other control lines. Therefore, the data "1" of the MNOS gate 21a of the memory cell block A is erased, and is replaced by the data "0". Similarly, the data "0" of the MNOS gate 21b of the memory cell block B maintains the data "0".

By this operation, the data of the MNOS gate in all of the memory cell blocks can be erased.

Write and write disable mode:

In the write mode, the separation gate 16 in FIG. 1 is turned off, the bit line 25 is set at high level, the selection gate 17 is turned on, and then a positive high voltage ($+HV$) is applied to the MNOS gate 21 to be written into. Afterwards, all of the other MNOS gates 20, 22, 23, other than the MNOS gate 21 to be written into are once turned on, and the bit line 25 is lowered to the ground level. Consequently, the MNOS gate 21 can be set at a positive high voltage ($+HV$), and the channel immediately beneath that gate can be set to the ground level. At this time, the area immediately beneath the MNOS gate 21 becomes an intensely inverted state. When this inverted state is held for several milliseconds, multiple electrons flow in immediately beneath the MNOS gate 21 through the selection gate 17 in the ON state and the other MNOS gates 23 and 22 in the ON state. These electrons are attracted to the MNOS gate 21 to which a positive high voltage ($+HV$) is applied, and are trapped in the silicon nitride layer 19. As a result, data "1" is written into the MNOS gate 21. As to the other MNOS gates 20, 22, 23, other than the MNOS gate 21, a voltage Vcc which is much lower than the positive high voltage ($+HV$) is applied, and furthermore the period being maintained Vcc level is quite short. (In this case, the period is a necessary time for transferring electrons from the bit line 25a to the channel immediately beneath MNOS gate 23 and is about 10 ns.) Therefore, data is not written in these MNOS gates 20, 22 and 23.

On the other hand, in the write disable mode, the separation gate 16 in FIG. 1 is turned off, the bit line 25 is set at high level, the selection gate 17 is turned on, and then a high positive voltage ($+HV$) is applied to the MNOS gate 21 to be disabled with respect to writing. Afterwards, the other MNOS gates 20, 22, and 23, other than the MNOS gate 21 to be disabled with respect to writing are once turned on, and the bit line 25 is kept at high level. Consequently, although a positive high voltage ($+HV$) is applied to the gate of the MNOS gate 21 to be disabled with respect to writing, the bit line 25 is kept at high level, and therefore electrons are not injected immediately beneath the MNOS gate 21. Accordingly, the area immediately beneath the MNOS gate 21 becomes only in a depletion state, and writing does not occur.

FIG. 6 shows these operations of write and write disable mode. As clear from FIG. 6, when multiple memory cell blocks A to D are provided, two or more MNOS gates are connected to a same word line, but only one of the MNOS gates among them is to be written into actually. For example, paying attention to the memory cell blocks A and B in FIG. 6 and two MNOS gates 21a, 21b are connected to one word line. In this case, when writing only into the MNOS gate 21b, the other MNOS gate 21a must be disabled with respect to writing. Because of this reason, such a write mode and a write disable mode must be realized simultaneously.

Referring to FIG. 6, the write and write disable operations are further described below.

In FIG. 6, too, data "0", "0", "1", "0" are respectively written into four MNOS gates 20a, 21a, 22a, 23a of the memory cell block A, and data "0", "0", "1", "0" are written in four MNOS gates 20b, 21b, 22b, 23b of the memory cell block B.

First, the control line 36-1 is set at the ground level by the separation gate control circuit 39, and the separation gates 16a and 16b of the memory cell blocks A and B are turned off. Next, by the write control signal, the gates 29 and 33 are turned on, and the bit line 25a is set at positive high voltage (+HV), and the other bit line 25b is set at ground level. By the Vcc delivered from the selection gate control circuit 40 to the control line 36-6, the selection gates 17a and 17b are both turned on. At the same time, Vcc is applied to the MNOS gates 20a-23a, 20b-23b of memory cell blocks A, B. Consequently if electrons exist immediately beneath the MNOS gates 20a-23a, they flow out to the bit line 25a, and the electrons disappear immediately beneath the MNOS gates 20a-23a. Afterward, the positive high voltage (+HV) is supplied to the control line 36-3 to which the MNOS gate 21b to b2 written is connected. As a result, electrons flow into the channel immediately beneath the MNOS gate 21b of memory cell block B from the bit line 25b, and its potential becomes ground level. Some of such electrons flow into the silicon nitride layer by the positive high voltage (+HV) applied to the MNOS gate 21b and are trapped. By this operation, the MNOS gate 21b is set to the write state. On the other hand, as to the MNOS gate 21a of memory cell block A, even when the gate voltage is changed from Vcc to the positive high voltage (+HV), only the depletion layer spreads in the portion immediately beneath the gate. Therefore, electrons does not flow into the portion immediately beneath the gate. Furthermore, all gate potentials are substantially equal. Accordingly electrons does not drift to the silicon nitride layer. By this operation, the MNOS gate 21a is set to the write disable state.

After the potential of the portion immediately beneath the MNOS gate 21b of memory cell block B becomes perfectly ground level (it takes about 10 ns for transferring electrons from the bit line 25b to the MNOS gate 21b), other MNOS gates 20a, 22a, 23a, 20b, 22b and 23b and the selection gates 17a, 17b are returned to the ground level. As to the MNOS gates 21a and 21b which are supplied the positive high voltage (+HV), the state is maintained for about 10 ns.

These operations are expressed in the voltage waveforms in FIG. 7.

Meanwhile, in each mode of write, write disable, and read, since other MNOS gates (for example, MNOS gates 20, 22, 23 in FIG. 1) other than the MNOS gate to be written into or to be write disabled (for example MNOS gate 21 in FIG. 1) are once turned on, a slight write field occurs. However, the dependency of the threshold voltage shift to the writing electric field of the MNOS gate works logarithmically. Accordingly, the electric field other than the writing electric field is set several times smaller than the writing electric field, and the application time is set at tens of nanoseconds, being sufficiently shorter than several milliseconds for the writing time, and therefore it is sufficient to refresh the data once in every 10$^7$ times of writing operation, and such data refresh operation is practically no problem.

Incidentally, in such a non-volatile memory device, although data "0" is written in the write mode, the data may actually change to "1".

Figure 8:
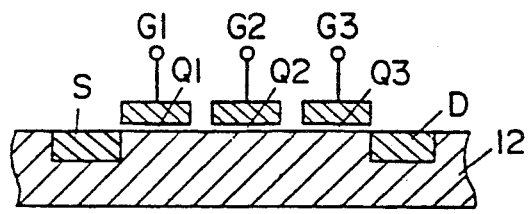
FIG. 8 is a sectional view showing a memory cell block of a semiconductor non-volatile memory device in accordance with a second embodiment of the present invention.
Figure 10:
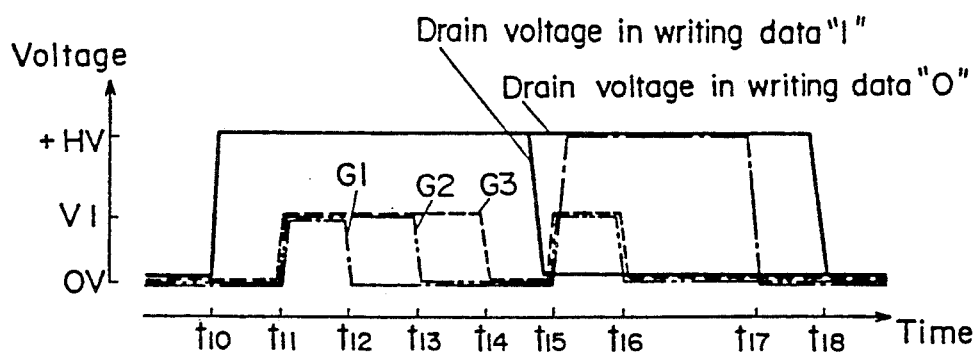
FIG. 10 is a diagram showing the write operation timing of the semiconductor non-volatile memory device shown in FIG. 8.

This reason is explained in FIG. 8 and FIG. 10.

FIG. 8 shows a cross section of a non-volatile memory device, in which a drain D (corresponding to the N+ diffusion drain 14 in FIG. 1) and a source S (corresponding to the N+ diffusion source line 13 in FIG. 1) are formed in the semiconductor substrate 12, and three MNOS gates Q1, Q2, Q3 are composed between them. In the diagram, G1, G2, G3 are gate electrodes of each MNOS gate.

Figure 11:
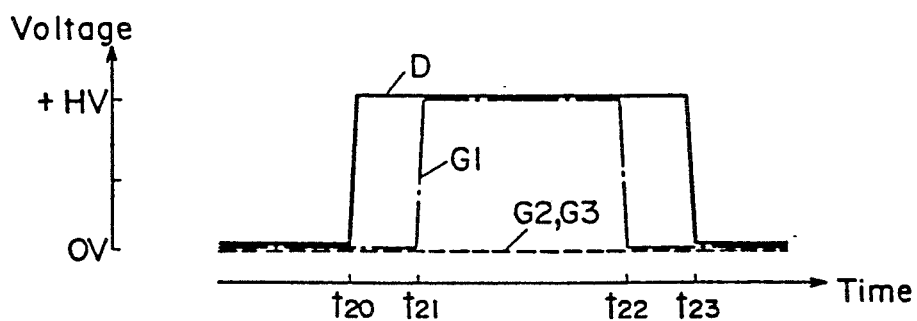
FIG. 11 is a diagram showing the write operation timing as the preliminary condition for the write operation in FIG. 10.

FIG. 11 shows an example of control timing of each node when writing data "0" to the MNOS gate Q1 already in erased state. Prior to start of the above action, the MNOS gates Q2 and Q3 are also in the erase state. During the operation, the source S adjacent to the MNOS date Q1 is supposed to be always open.

At timing $t_{20}$ shown in FIG. 11, when the potential of the drain D is set to the positive high voltage (+HV) (namely, the write disable state), the electrons induced on the surface of the substrate immediately beneath the MNOS gates Q1, Q2, Q3 in the erase state are sucked out into the drain D, and the substrate surface immediately beneath the MNOS gates Q1, Q2, Q3 is set to the depletion state. Next, at timing $t_{21}$, a writing voltage (+HV) is applied to the gate electrode G1 of the MNOS gate Q1. At this time, since the other MNOS gates Q2 and Q3 are in the OFF state, even after the writing voltage (+HV) is applied to the gate electrode G1, the substrate surface immediately beneath the MNOS gate Q1 maintains the depletion state. Therefore, the electron injection into the trap center of the silicon nitride layer does not occur, and the trap electric charge amount is not changed.

In the next cases to be explained, before the action of writing data "0" in the MNOS gate Q1 already in the erase state, the other MNOS gates Q2 and Q3 are supposed to be in the erase state (data "0") and write state (data "1"), respectively.

In this case, at timing $t_{20}$, the drain D is set at the writing voltage (+HV), but the MNOS gate Q3 remains in the OFF state because it is in write state. Therefore, the electrons induced on the substrate surface immediately beneath the MNOS gates Q1 and Q2 have their escape route closed and stay on the substrate surface immediately beneath the gate. In this state, at timing $t_{21}$, when a high voltage for writing (+HV) is applied to the gate electrode of the MNOS gate Q1, the electrons staying on the substrate surface immediately beneath the MNOS gates Q1 and Q2 are injected into the trap center in the silicon nitride layer of the MNOS gate Q1. By this electron injection, the trapped total electric charge amount is changed. As a result, the threshold voltage of the MNOS gate Q1 is shifted slightly, and thus, the MNOS gate Q1 tends to be written into.

In FIG. 8, three MNOS gates Q1 to Q3 are shown, but as the number of MNOS gates connected in series increases and the number of MNOS gates in the erase state adjacent to the MNOS gate in which data "0" is written into increases, the electron injection amount in the trap center accompanied by writing of data "0" increases. When this injection amount exceeds the positive electric charge amount having being trapped before writing, although data "0" is written into the MNOS gate to which data "0" is to be written, the data of the MNOS gate is changed to "1".

Accordingly, in order to solve the problem of this error by depleting the substrate surface immediately beneath the MNOS gate by using electric charge transfer method in the write process, a second embodiment of this invention is explained below while referring to FIG. 8 to FIG. 10.

FIG. 10 shows the control timing of each mode in the operation of writing data "0" or data "1" to the MNOS gate Q1 already in the erase state in the non-volatile memory device having a sectional structure as shown in FIG. 8. FIG. 9 shows a potential profile of electrons on the substrate surface of the non-volatile memory device at each timing in FIG. 10, in relation to the device structure shown in FIG. 8.

Figure 9:
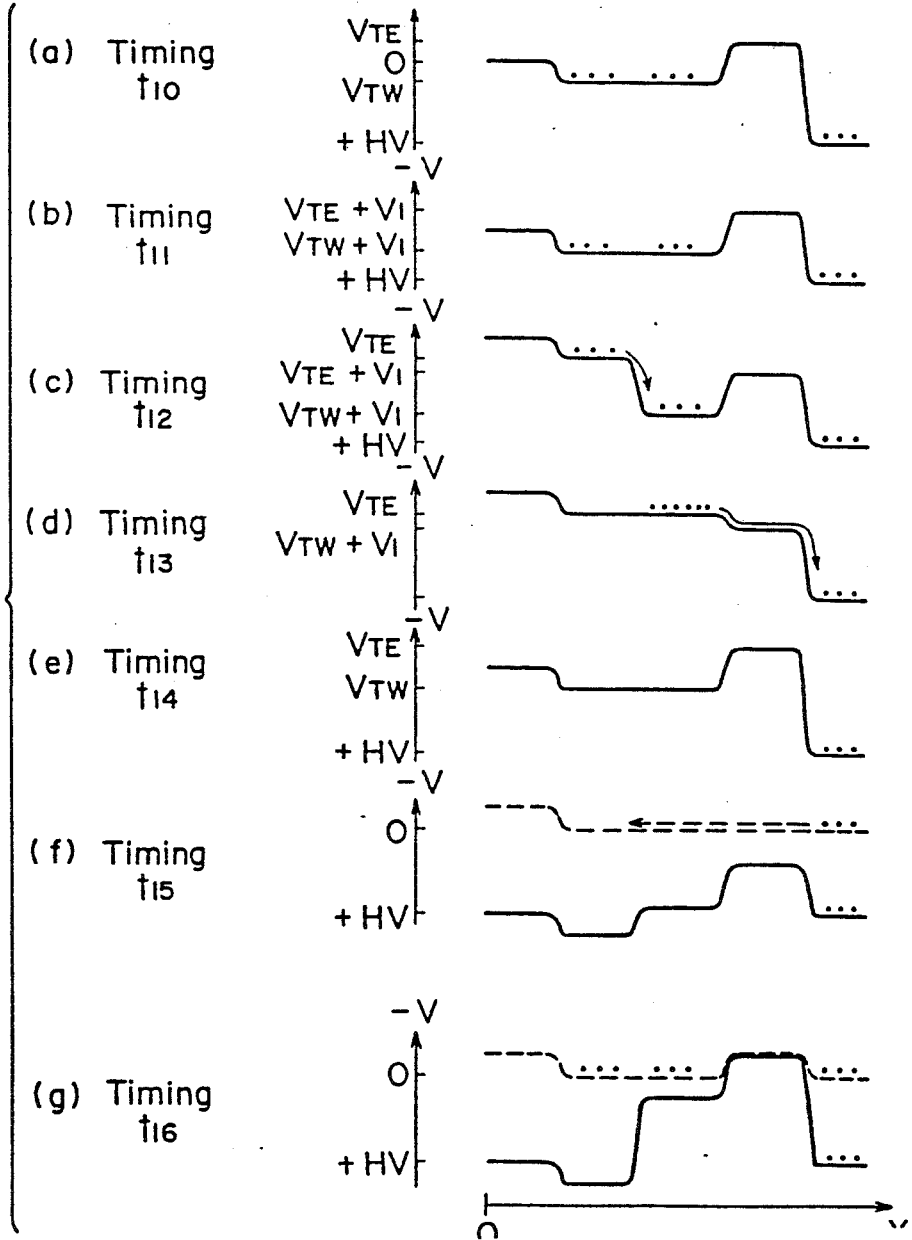
FIG. 9 is a diagram showing a potential profile of electrons on the substrate surface in a write operation of the semiconductor non-volatile memory device shown in FIG. 8.

Referring to FIG. 8 to FIG. 10, the operation of changing the MNOS gate Q1 already in the erase state into the write state is explained below. Prior to this operation, the MNOS gates Q2 and Q3 are supposed to be in the erase state (data "0") and the write state (data "1"), respectively.

First, at timing $t_{10}$, a writing voltage (+HV) is applied to the drain D. At this time, the MNOS gate Q3 is in the OFF state because the data is "1", that is, a negative electric charge is trapped, and the electrons on the substrate surface immediately beneath the MNOS gate Q2 and Q3 are not changed (FIG. 9-$a$).

At next timing $t_{11}$, voltage V1 is applied to the gate electrodes G1, G2, G3 (FIG. 9-$b$). This voltage V1 must satisfy the following conditions.

$$V1 \geq VTW + |VTE|$$

where
VTW: threshold voltage when the MNOS gate is in the write state (>0 V)
VTE: threshold voltage when the MNOS gate is in the erase state (<0 V)

Afterwards, at timing t12, t13, t14, the gate electrodes G1, G2, G3 of the MNOS gates Q1, Q2, Q3 are sequentially returned to 0 V (FIG. 9-$c$, $d$, $e$). As a result, the electrons on the substrate surface immediately beneath the MNOS gates Q1 and Q2 are sequentially transferred in the lateral direction, and are finally purged away to the drain D, so that no electron exists on the substrate surface beneath any one of the MNOS gates Q1, Q2, Q3 (FIG. 9-$e$).

Next, between timing t15 and t16, a high voltage for writing (+HV) is applied to the gate electrode G1, and a voltage V1 is applied to the gate electrodes G2, G3.

At this time, when the drain D is at 0 V (that is, when writing data "1"), electrons are supplied onto the substrate surface immediately beneath the MNOS gate Q1 from the drain D through the MNOS gates Q3 and Q2 (see the dotted arrow in FIG. 9-$f$). At the same time, the electrons begin to be injected into the trap in the silicon nitride layer, and this electron injection continues up to timing t17. As a result, the MNOS gate Q1 is changed from the erase state to the write state.

On the other hand, when a high voltage for writing (+HV) is applied to the drain D for setting to write disable state (that is, when writing data "0"), since electrons are not supplied from the drain as indicated by the dotted arrow in FIG. 9-$f$, the substrate surface immediately beneath the MNOS gates Q1, Q2, Q3 maintains the depletion state (see the solid line in FIG. 9-$f$). Accordingly, until the next timing t17, electron injection into the trap center of MNOS gate Q1 does not occur.

In the foregoing explanation, the state of the MNOS gates Q2 and Q3 before the writing action is specified, but whatever the state of the MNOS gates Q2 and Q3 may be, the discharged state of electrons on the substrate surface immediately beneath the MNOS gates Q1, Q2 and Q3 may be realized by the writing method shown in FIG. 9 and FIG. 10, and by passing through this process, data "0" can be written without generating electric charge injection into the trap center. Of course, writing of data "1" can be also executed.

In FIG. 8 to FIG. 10, three MNOS gates are connected in series, but regardless of the number of MNOS gates connected in series, the substrate surface beneath the gate can be set in the depletion state by employing the electric charge transfer method shown in FIG. 9 and FIG. 10. As mentioned above, this electric charge transfer method is more effective when the number of MNOS gates connected in series is increased.

Figure 12:
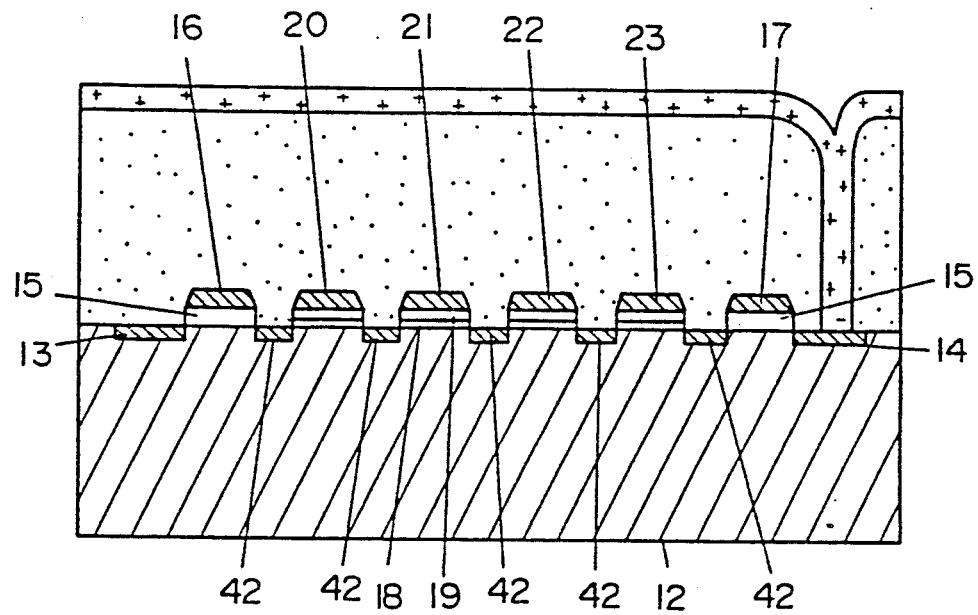
FIG. 12 is a sectional view of a memory cell block of a semiconductor non-volatile memory device in accordance with a third embodiment of the present invention.
Figure 13:
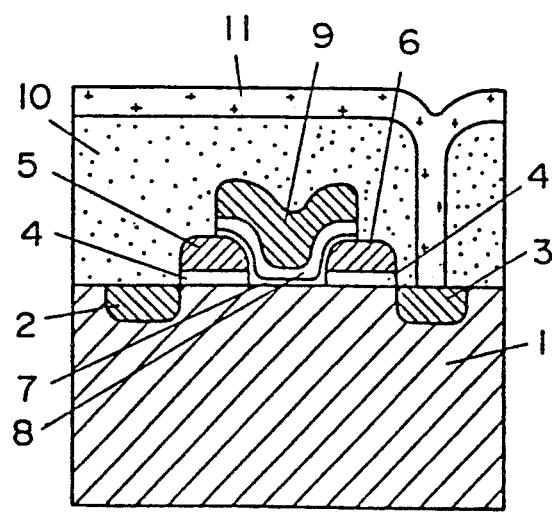
FIG. 13 is a sectional view of a memory cell block of a conventional semiconductor non-volatile memory device.

A third embodiment of the invention is shown in FIG. 12, in which $N^-$ diffusion regions 42 are disposed in the substrate surfaces in the mutually adjacent parts of the $N^+$ diffusion source line 13, separation gate 16, MNOS gates 20 to 23, selection gate 17, and $N^+$ diffusion drain 14 shown in FIG. 1. In this structure, four MNOS transistors are connected in series between the diffusion source line 13 and diffusion drain 14. In this constitution, the same effects as in the embodiment in FIG. 1 are obtained. In other words, the embodiment in FIG. 1 has the multigate between the source and drain, while the embodiment in FIG. 12 has the NAND gate between the source and drain.

In these foregoing embodiments, N channel semiconductor non-volatile memory devices are presented, but, needless to say, the same effect are obtained in P channel devices.

Besides, in the above embodiments, the MNOS (metal-nitride-oxide-semiconductor) structure is employed, but the MONOS (metal-oxide-nitride-oxide-semiconductor) structure may be also employed. Still more, there is no particular limitation as far as the transistors are of the MINOS (metal-insulator-oxide-semiconductor) or MOIOS (metal-oxide-insulator-oxide-semiconductor) structure represented by these MNOS and MONOS structures.

We claim:

1. A semiconductor non-volatile memory device with memory cell blocks comprising:
   a source region and a drain region of a second conductivity type formed on a semiconductor substrate of a first conductivity type, and
   at least two series coupled data storage parts located along a surface of said semiconductor substrate between said source region and said drain region;
   wherein a separation gate is formed between one of said at least two data storage parts and said source region, and a selection gate is formed between another one of said at least two data storage parts and said drain region;
   wherein said at least two data storage parts are comprised of: a very thin oxide layer formed on the surface of said semiconductor substrate of said first conductivity type; an insulation layer formed on the surface of said very thin oxide layer; and a plurality of gates formed on the surface of said insulation layer without a gap being present between adjacent gates.

2. A semiconductor non-volatile memory device of claim 1, wherein a second oxide layer is disposed between said insulation layer and said plurality of gates.

3. A semiconductor non-volatile memory device of claim 1, wherein said insulation layer comprises silicon nitride.

* * * * *